(12) United States Patent
Fuergut et al.

(10) Patent No.: US 10,573,533 B2
(45) Date of Patent: Feb. 25, 2020

(54) METHOD OF REDUCING A SHEET RESISTANCE IN AN ELECTRONIC DEVICE, AND AN ELECTRONIC DEVICE

(71) Applicant: Infineon Technologies AG, Neubiberg (DE)

(72) Inventors: Edward Fuergut, Dasing (DE); Irmgard Escher-Poeppel, Duggendorf (DE); Stephanie Fassl, Villach (AT); Paul Ganitzer, Finkenstein (AT); Gerhard Poeppel, Duggendorf (DE); Werner Schustereder, Villach (AT); Harald Wiedenhofer, Bad Abbach (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/116,210

(22) Filed: Aug. 29, 2018

(65) Prior Publication Data
US 2019/0013210 A1     Jan. 10, 2019

Related U.S. Application Data

(62) Division of application No. 15/151,857, filed on May 11, 2016, now abandoned.

(30) Foreign Application Priority Data

May 12, 2015   (DE) .......................... 10 2015 107 489

(51) Int. Cl.
*H01L 21/324*    (2006.01)
*H01L 23/31*     (2006.01)
(Continued)

(52) U.S. Cl.
CPC ........ *H01L 21/324* (2013.01); *H01L 21/0455* (2013.01); *H01L 21/0485* (2013.01); *H01L 21/2254* (2013.01); *H01L 21/2258* (2013.01); *H01L 21/268* (2013.01); *H01L 21/28512* (2013.01); *H01L 21/28575* (2013.01); *H01L 23/3157* (2013.01)

(58) Field of Classification Search
None
See application file for complete search history.

(56) References Cited

U.S. PATENT DOCUMENTS 5,980,265 A    11/1999   Tischler
6,064,112 A    5/2000    Iwaya
(Continued)

FOREIGN PATENT DOCUMENTS

DE    102008001230 A1    10/2008
DE    102009002519 A1    10/2010

*Primary Examiner* — Hoang-Quan T Ho
*Assistant Examiner* — Jordan M Klein
(74) *Attorney, Agent, or Firm* — Dicke, Billig & Czaja, PLLC

(57) ABSTRACT

Various embodiments provide a method of reducing a sheet resistance in an electronic device encapsulated at least partially in an encapsulation material, wherein the method comprises: providing an electronic device comprising a multilayer structure and being at least partially encapsulated by an encapsulation material; and locally introducing energy into the multilayer structure for reducing a sheet resistance.

13 Claims, 1 Drawing Sheet

(51) Int. Cl.
*H01L 21/268* (2006.01)
*H01L 21/04* (2006.01)
*H01L 21/225* (2006.01)
*H01L 21/285* (2006.01)

(56) References Cited

U.S. PATENT DOCUMENTS

| | | | | |
|---|---|---|---|---|
| 2001/0015442 | A1* | 8/2001 | Kondoh | G01L 33/40 |
| | | | | 257/79 |
| 2004/0012958 | A1* | 1/2004 | Hashimoto | H01L 33/38 |
| | | | | 362/241 |
| 2005/0056831 | A1* | 3/2005 | Senda | H01L 33/22 |
| | | | | 257/40 |
| 2005/0287687 | A1* | 12/2005 | Liao | H01L 33/0066 |
| | | | | 438/22 |
| 2006/0079086 | A1* | 4/2006 | Boit | H01J 37/228 |
| | | | | 438/662 |
| 2007/0161217 | A1 | 7/2007 | Salinas | |
| 2008/0099769 | A1 | 5/2008 | Rupp | |
| 2010/0059787 | A1* | 3/2010 | Hoshina | H01L 33/54 |
| | | | | 257/100 |
| 2010/0163210 | A1 | 7/2010 | Kluge | |
| 2011/0298352 | A1* | 12/2011 | Velu | F21V 29/74 |
| | | | | 313/46 |
| 2012/0092842 | A1 | 4/2012 | Neumeister | |
| 2012/0261693 | A1* | 10/2012 | Chen | H01L 33/642 |
| | | | | 257/98 |
| 2013/0234180 | A1* | 9/2013 | Chiu | H01L 33/60 |
| | | | | 257/98 |
| 2014/0264951 | A1* | 9/2014 | Faruqui | H01L 23/5389 |
| | | | | 257/783 |
| 2014/0332950 | A1 | 11/2014 | Iwata | |
| 2015/0108564 | A1 | 4/2015 | Miura | |

* cited by examiner

METHOD OF REDUCING A SHEET RESISTANCE IN AN ELECTRONIC DEVICE, AND AN ELECTRONIC DEVICE

CROSS REFERENCE TO RELATED APPLICATION

The present application is a divisional application of U.S. patent application Ser. No. 15/151,857, filed May 11, 2016, and claims priority to German Patent Application No. 10 2015 107 489.3, filed May 12, 2015, both of which are incorporated herein by reference.

TECHNICAL FIELD

Various embodiments relate to a method of reducing a sheet resistance in an electronic device, and an electronic device.

BACKGROUND

In the field of electronic devices packaged electronic chips or electronic chips encapsulated in an encapsulation material or encapsulant are widely used. Furthermore, the miniaturization of the electronic chips advances more and more. Even in the field of power chips or power electronic devices the thickness of the electronic chips are reduced more and more leading to the effect that the semiconductor layers are quite thin, e.g. below 50 micrometer even in the field of power modules. However, due to the low thickness of the semiconductor layer these layers are difficult to handle so that often additional handling layers are used. In particular when processing the backside (after the frontside of the chip has already processed) a relatively early formed encapsulation of an encapsulation material may also be used as a support layer or structure for handling the thin semiconductor layer or multilayer structure.

However, the encapsulation material is typically formed after processing the frontside of the electronic chip and the subsequent processing of the backside of the electronic chip is thus limited by the physical properties of the encapsulation material.

SUMMARY

Various embodiments provide a method of reducing a sheet resistance in an electronic device, wherein the method comprises providing an electronic device comprising a multilayer structure; and locally introducing energy into the multilayer structure for reducing a sheet resistance.

Furthermore, various embodiments provide a method of manufacturing an electronic device, wherein the method comprises: providing a raw electronic device comprising an electronic chip; forming a contact layer onto the electronic chip; and processing the contact layer by locally introducing energy into the contact layer.

Moreover, various embodiments provide an electronic device comprising: a semiconductor chip comprising a multilayer structure comprising a semiconductor layer and a metallization layer, wherein the electronic device comprises a backside comprising at least one first portion and at least one second portion, wherein the at least one first portion and the at least one second portion were exposed to a different temperature during the manufacturing process of the electronic device.

BRIEF DESCRIPTION OF THE DRAWINGS

In the drawings, like reference characters generally refer to the same parts throughout the different views. The drawings are not necessarily to scale. Instead emphasis is generally being placed upon illustrating the principles of the invention. In the following description, various embodiments are described with reference to the following drawings, in which.

DETAILED DESCRIPTION

Figure 1:
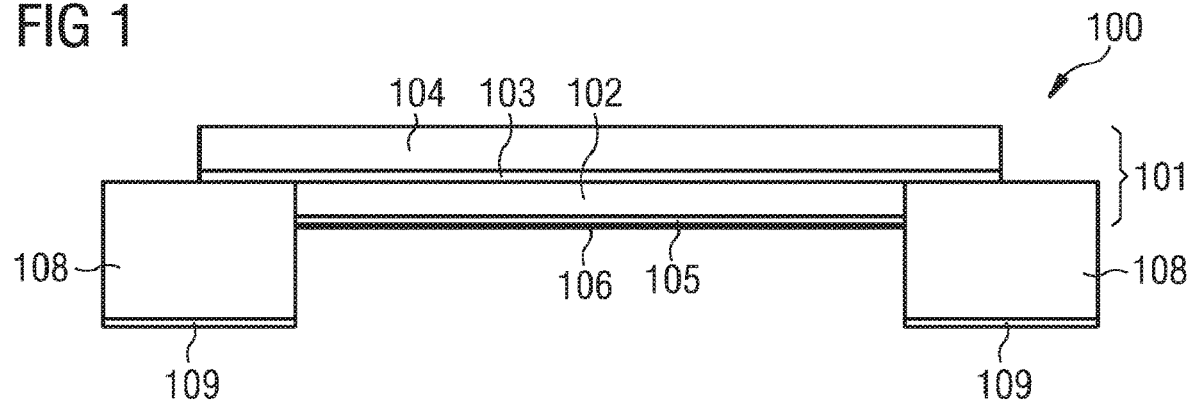
FIG. 1 schematically shows a detail of an electronic device according to an exemplary embodiment.

In the following further exemplary embodiments of a method of reducing a sheet resistance in an electronic device and an electronic device are described. It should be noted that the description of specific features described in the context of one specific exemplary embodiment may be combined with others exemplary embodiments as well.

The word "exemplary" is used herein to mean "serving as an example, instance, or illustration". Any embodiment or design described herein as "exemplary" is not necessarily to be construed as preferred or advantageous over other embodiments or designs.

Various exemplary embodiments provide a method wherein a sheet resistance in an electronic device encapsulated at least partially in an encapsulation material is reduced wherein the method comprises providing an electronic device comprising a multilayer structure and being at least partially encapsulated by an encapsulation material; and introducing a higher amount of energy into the multilayer structure than in the encapsulation material.

Various embodiments provide a method of reducing a sheet resistance in an electronic device encapsulated at least partially in an encapsulation material, wherein the method comprises: providing an electronic device comprising a multilayer structure and being at least partially encapsulated by an encapsulation material; and locally introducing energy into the multilayer structure for reducing a sheet resistance.

Furthermore, various embodiments provide a method of manufacturing an electronic device, wherein the method comprises: providing a raw electronic device comprising an electronic chip and an encapsulation material at least partially enclosing the electronic chip; forming a contact layer onto the electronic chip; and processing the contact layer by locally introduce energy into the contact layer.

Moreover, various embodiments provide an electronic device comprising: a semiconductor chip comprising a multilayer structure comprising a semiconductor layer and a metallization layer; and an encapsulation material at least partially encapsulating the semiconductor chip, wherein the encapsulation material and the metallization layer were exposed to different temperatures during the manufacturing process of the electronic device.

For example, the electronic device or electronic module may be a power module, e.g. may comprise a power transistor (SFET or IGBT, or the like) and/or a power diode, wherein the multilayer structure forms a part of the power transistor, for example.

In particular, the term "locally introducing energy" may particularly denote that the energy is introduced only or at least to a greater amount in some portions of the electronic device and at least less in other portions of the electronic device. Thus, the term "locally introducing energy" may as well describe an inhomogeneous introducing of energy. In particular, no or at least less energy may be introduced into an encapsulation material or another dielectric layer formed on the (backside) of the electronic device. The inhomogeneity may be determined by a difference of energy introduced into the different portions, e.g. the introducing of energy may be at least 50% higher in some portions (e.g. the multilayer structure) than in other portions (e.g. the encapsulation material).

Such an inhomogeneous introducing of energy may be a suitable way to, on the one side, reduce the sheet resistance in the multilayer structure (e.g. by tempering and/or activating a dopant and/or compacting a layer of the multilayer structure) while at the same time protect the other portions, e.g. an encapsulation material (which is typically an organic compound) or a dielectric material from detrimental effects due to an increase of temperature.

Thus, a general idea of exemplary embodiments may be to introduce energy into a multilayer structure or the electronic device inhomogeneous for changing or modifying selectively physical properties, e.g. sheet resistances, of some portions while other portions are protected from negative effects caused by a temperature increase.

In particular, the electronic device may be a power module. For example, the metallization layer may be on the backside of the semiconductor chip. It should be noted that the term "metallization layer" should be interpreted in a broad sense and may denote a layer having a specific resistance in the range of a conductive material and may in particularly denote not only metals but also electrically conductive semiconductors. That is, the term may be defined in a functional sense and may encompass all materials suitable for forming an electrical contact for the semiconductor chip.

It should be noted that even in the completed electronic device it may be possible to verify whether the different areas or portions were exposed to different temperatures during the manufacturing process. For example, the structure of the metallization layer, e.g. copper or aluminum layer, may depend on the energy introduced in the different areas or portions of the multilayer structure and thus to the temperature it was exposed to during the manufacturing process.

In particular, the structure may be different in case a temperature was higher than 260° C., preferably higher than 280° C. or even higher than 300° C., e.g. a temperature about 320° C. which is higher than typical encapsulation materials (e.g. mold compounds) can be exposed to without detrimental or damaging effects. This, may be in particular true for multilayer structures comprising a thinned semiconductor layer (e.g. silicon) encapsulated at least partially by an encapsulation material (forming a Fan-Out-Area).

In the following exemplary embodiments of the method of reducing a sheet resistance in an electronic device are described. However, the features and elements described with respect to these embodiments can be combined with exemplary embodiments of the electronic devices.

According to an exemplary embodiment of the method the locally energy introduction is performed from a backside of the electronic device.

In particular, the local or inhomogeneous energy introduction may be a suitable measure for processing or modifying physical characteristics of the backside which is typically as well processed in case of electronic devices comprising vertical integrated structures like IGBTs for example.

According to an exemplary embodiment of the method the multilayer structure is at least partially encapsulated by an encapsulation material.

In particular, the encapsulation material or encapsulant may be mold compounds (like epoxy, polyimide, silicone, or bismaleimide), laminates, dielectric materials and/or silicone based materials.

According to an exemplary embodiment of the method the multilayer structure comprising a metallization layer.

In particular, the metallization layer may form a surface layer at the point in time the step of locally introducing energy is performed. For example, the metallization may be formed on the backside of the electronic device, e.g. by a sputtering process or a deposition process like an epitaxial process, plasma-deposition process, galvanic deposition process or by printing and subsequent laser sintering. Thus, the metallization layer may form a backside contact the electrical and/or thermal contact of which may be important for the performance of an electronic device based on a vertical current flow, like in typical IGBT, SFET or the like. A good electrical and/or thermal contact may reduce the total losses and the junction temperature so that a higher nominal current or a smaller chip may be enabled which in turn may as well increase a power density and/or reduce dimensions of the electronic (power) device or module.

According to an exemplary embodiment of the method the locally introducing of energy is performed in such a way that the encapsulation material remains at a temperature which is below a predetermined threshold.

In particular, the predetermined threshold may depend on the temperature stability of the encapsulation material. For typical mold compounds it may be in the range of (substantially) 300° C., preferably 280° C., more preferably 260° C. or even more preferably below 240° C. It should be noted that the described thresholds may as well depend on the duration of energy introduction (and thus temperatures). For example, the a temperature limit may be 260 C. for maximum for not more than 15 minutes, preferably for not more than 10 minutes or even more preferably for not more than 5 minutes.

For example, the temperature may be kept low by using a pulsed energy input, e.g. by using laser pulses or pulsed infrared light. For example, the laser pulses may have a duration in the order of microseconds or even below, e.g. in the order of 100 microseconds (and may be used to perform a laser tempering process or step). Pulses of such a short duration may limit the increase of temperatures to few micrometers of the irradiated layer. In particular, a focusable laser or focusable laser pulse may enable a vertical and horizontal limitation of the energy input and/or heating. Thus, it may be possible to avoid that adjoining encapsulation materials may (substantially) be heated up. In particular since encapsulation materials typically have low thermal conductivity so that a heating up of an adjoining other layer (e.g. metallization and/or semiconductor layer) may not heat up the encapsulation material but it maintain at tolerable temperatures. This may in particular be true for short energy pulses, e.g. laser pulses having a duration in the order of microseconds.

According to an exemplary embodiment of the method the multilayer structure comprises a semiconductor layer having a thickness of less than 200 micrometer.

In particular, the thickness may be in the range between 50 nanometer and 100 micrometer, more preferably in the range between 100 nanometer and 10 micrometer, e.g. in the range between 100 nanometer and 10 micrometer. In particular, the multilayer structure may comprise a semiconductor layer, e.g. a bulk layer of a transistor, having a thickness below 50 micrometer, preferably the semiconductor layer may be a so called thin layer, having a thickness in the range of less than 30 micrometer, e.g. between 1 micrometer and 10 micrometer or even 1 micrometer and 3 micrometer.

According to an exemplary embodiment of the method wherein the energy is locally introduced by using a light source.

In particular, the light source may be a laser, e.g. may be a focusable laser and/or a (mask layer) may be used which may shield the encapsulation material and/or portions of the multilayer structure, e.g. an outermost layer of the multilayer structure. Such a focusable laser may particularly a suitable measure to limit the energy introduction in a vertical and/or horizontal direction. As well any sort of broad wavelength distribution light source, e.g. a rapid thermal processing (RTP) light source or halogen lamp light source together with a mask layer may be used. The wavelength of the laser may be in the range of 250 nm to 500 nm, e.g. about 300 nm. By choosing an appropriate wavelength of the laser light the penetration depth may also be selected accordingly.

By using a focusable or (direct-)writinglaser it may be possible to focus the energy introduced at relatively small portions or areas (vertically and/or horizontally) thus it may be possible to only locally heating up the electronic chip or metallization while (substantially)not heating up a surrounding area like an encapsulation material. Therefore, additionally process steps like forming and structuring a mask (layer) may be avoidable.

By using a mask or mask layer it may be possible to use a light source or laser having a relatively large light beam so that a large area of the metallization layer and/or semiconductor chip may be heated up simultaneously thus a large throughput may be possible. In particular, such a mask may comprise a reflective layer and/or an additional shutter or a (metal) foil like layer which can be peeled after use.

According to an exemplary embodiment of the method the light source is one selected out of the group consisting of: laser; focusable laser; rapid thermal processing light source; and lamps.

According to an exemplary embodiment the method further comprises forming a mask before applying the energy.

In particular, the mask may be a (reflective or non-reflective) mask, e.g. a mask layer, shutter and/or an (adhesive)foil protecting specific areas or portions from the irradiation.

In particular, a reflective mask (layer) may function as a mask layer protecting a layer, e.g. a semiconductor layer of the electronic chip and/or the encapsulation material from the locally introduced energy. It should be noted that a reflective mask may be a suitable measure to avoid that energy, e.g. in the form of light (e.g. laser or infrared light) is introduced in specific areas of the encapsulation material and/or electronic device and/or electronic chip. The reflective layer may afterwards be removed by a plasma process, e.g. an etching process. Suitable materials for the reflective mask may comprise titan, e.g. titanium tungsten, aluminum or copper.

It should be noted that the (reflective or non-reflective) mask (layer) may be a layer which is formed or deposited specific for performing the mask function with respect to the introducing of the energy or may be a layer which is deposited anyway. For example, the reflective layer may be formed by an aluminum layer or copper layer which is deposited for contacting purposes. Such an aluminum layer or copper layer may be processed, e.g. structured afterwards, to form a reflective layer at specific portions or areas in the subsequent energy introduction step.

According to an exemplary embodiment of the method the forming of the mask includes a patterning of the mask.

In particular, a mask, e.g. a reflective mask layer, may be formed by an aluminum layer being part of a multilayer structure (e.g. Al/Ti, or Al/Ti/TiN) or a single layer (e.g. aluminum or copper) forming a contacting and/or barrier layer structure typically used for contacting a semiconductor layer. During the patterning or structuring portions deposited on an encapsulation material may be maintained or modified to be reflective or anti-reflective.

For example, on an encapsulation material, a titanium layer and/or titanium nitride layer may be removed to expose an aluminum layer which per se typically has a good reflection characteristic. At the same time such a titanium layer (often used as a barrier layer anyway) may remain or even be modified at the portions to be processed or modified (e.g. tempered or compacting) by an increase of temperature. After the introduction of the energy the reflective or non-reflective mask (layer) may be removed.

For example, the reflective or non-reflectivemask (layer) may comprise or may consist of aluminum, titan or copper. In particular, the reflective mask layer may be formed (primarily) on the encapsulation material. The forming and/or structuring of the mask and/or absorption layer may be performed by common photolithography techniques or processes, e.g. may include forming of a photoresist layer, structuring and/or developing the same and performing additional removal steps afterwards.

According to an exemplary embodiment the method further comprises forming an absorption layer before applying the energy.

In particular, the absorption layer or anti-reflective layer may be formed in the regions or portions of the multilayer structure and/or metallization and/or semiconductor layer (e.g. silicon layer) which shall be thermally processed. The use of an absorption layer may increase the amount of energy introduced in the areas covered by the absorption layer.

For example, the absorption layer may comprise or may consist of TiN, black copper or any other suitable material having a relatively high degree of absorbing light energy. In particular, the surface portions of the electronic devices formed by an encapsulation material may be covered or protected by the reflective mask layer while the portions of the multilayer structure intended to be processed (e.g. heated up) by the locally introduced energy may be covered by the absorption layer. Thus, it may be possible to introduce energy locally or in homogeneously into the multilayer structure and protecting at the same time the encapsulation material forming an encapsulation of the electronic device. After the introduction of the energy the absorption layer may be removed.

According to an exemplary embodiment of the method a layer of the multilayer structure is selected out of the group consisting of: a metallization layer; a contact layer; a layer of porous metal; a doped layer; a semiconductor layer.

The term "metallization layer" may particularly denote a relatively thick layer having a low electrical resistance and functioning as a contact for contacting other layers of the multilayer stack, e.g. layers forming a bulk of a transistor.

The term "contact layer" may particularly denote a relatively thin layer, e.g. in the range of 10 to 500 nanometer, which is formed on a semiconductor and used to reduce a contact resistance. The contact layer may be formed by sputtering, e.g. by sputter aluminum onto or into a semiconductor layer. This reduction of the contact resistance may be achieved by diffusion or penetrating of material of the contact layer, e.g. aluminum, into the semiconductor material which may reduce the contact resistance. This diffusion or penetrating of the contact layer material may be increased by the locally introduced energy. Thus, it may be possible to reduce the sheet resistance or contact resistance for contacting the multilayer structure.

A layer of porous metal, like porous copper or aluminum, may form a metallization or contact layer or may form an internal layer of the multilayer structure. By introducing energy (leading to an increase of the temperature in the respective layer) it may be possible to compact or densify the respective porous layer so that a sheet resistance may be reduced. Due to the locally introduction of energy it may be possible to avoid the heating of the complete system or electronic device. Thus, it may be possible that a great part or the whole processing may be performed at a relatively low temperature (e.g. below a temperature being detrimental for an encapsulation material) which may be beneficial for the performance or yield of the electronic devices afterwards. Furthermore, the lower temperatures may increase as well the stability against external influences, e.g. due to the processing atmosphere.

By locally or selectively introducing energy into a doped layer (e.g. a doped semiconductor layer) of the multilayer structure it may be possible to reduce a sheet resistance of the multilayer structure by enabling local diffusion of the dopants or creating local doping profiles and/or enabling a local activation of the dopants. For example, a semiconductor (e.g. Si-layer) may be doped by phosphorous and/or boron or any other suitable dopants and may be activated by the locally or selectively introduced energy.

At the same time the dopants may remain at or closer to the surface in the encapsulation material (into which no or less additional energy is introduced). In a further step the surface of the encapsulation material (and thus the dopants) may be removed afterwards, e.g. by a polishing step, so that the isolating characteristic of the encapsulation material is maintained. Thus, the step of locally introducing energy may form a diffusion and/or activation step which may be followed by a (selective) removal step, e.g. in the areas or portions not activated.

In particular, a process including no mask layer may be used for densification of porous copper (at backside and/or at frontside, e.g. inside vias or cavities) and/or for activating dopants.

In particular, the semiconductor layer may comprise or may consist of Si, GaN, GaAs or SiC and may form a bulk layer of a transistor.

According to an exemplary embodiment of the method the locally introduced energy is used to densify a porous metal layer of the multilayer structure.

In particular, the porous metal layer may comprise or consist of copper and/or aluminum. Such a densification process or step may be performed by using a mask, by using an unmasked process, by using a focused light source and/or by using an unfocused light source.

According to an exemplary embodiment of the method the locally introduced energy is used to activate dopants doped into the multilayer structure.

By introducing locally energy, leading to a (possible) temperature rise, it may be possible to influence stress or strain in the multilayer structure of the encapsulated electronic device or package. For example, the multilayer structure may comprise silicon and copper compounds or which is at least partially encapsulated by an encapsulation material. All of these compounds or layers may have different heating and cooling behavior forming a kind of hysteresis curve during heating and/or cooling. Thus, it may be possible to willingly perform a recrystallization of a layer of the multilayer structure (e.g. the copper layer) in the package leading to stress or strain in another layer (e.g. the silicon layer) which may modify the properties of the layers (e.g. the band gap of the silicon layer) which may as well reduce or at least modify the sheet resistance. This may as well be used for repairing drift effects sometimes arise due to stress or strain relaxations. Furthermore, it should be mentioned that the use of dopants and a subsequent activation by the locally introduced energy may modify the band gap and thus the sheet resistance as well.

In the following exemplary embodiments of the electronic device are described. However, the features and elements described with respect to these embodiments can be combined with exemplary embodiments of the method of reducing a sheet resistance in an electronic device.

According to an exemplary embodiment of the electronic device the at least one first portion is formed by the metallization layer and the at least one second portion is formed by an encapsulation material.

According to an exemplary embodiment of the electronic device the semiconductor layer has a thickness of less than 50 micrometer.

In particular, the thickness may be less than 30 micrometer, preferably in the range of 0.5 micrometer to 10 micrometer, e.g. in the range of 1 to 5 micrometer. Thus, the semiconductor layer may be a thinned semiconductor layer.

According to an exemplary embodiment of the electronic device the metallization layer may comprising a material selected out of the group consisting of: copper; aluminum; and a mixture thereof In the following specific embodiments of the electronic device and the method of reducing a sheet resistance of a multilayer structure of an electronic device will be described in more detail with respect to the figures. Some of the described embodiments may provide one of the following effects or benefits. In particular, it may be possible to create a low contact resistance or sheet resistance even for (very) thin semiconductor chips and/or to process the backside metallization at room temperature (only locally heating up) by locally introducing energy.

FIG. 1 schematically shows a detail of an electronic device 100 according to an exemplary embodiment. In particular, the electronic device 100 comprises a multilayer structure or stack 101 comprising an embedded chip 102 on the frontside of which an intermediate or contact layer 103 is arranged which comprises aluminum, for example, and on which in turn a metallization layer 104 is formed, e.g. made of copper, which forms the frontside contacts. Between the electronic chip 102 and the intermediate layer 103 a barrier layer 107, e.g. made of titanium, may be arranged.

On the backside of the embedded chip an aluminum layer 105 made of aluminum and a barrier layer (not shown in FIG. 1) made of or comprising titanium may be arranged which may be at least partially modified to an absorption layer 106, e.g. by forming an TiN layer from the titanium of the barrier layer. Alternatively, an additional TiN layer may be formed on the titanium layer. Furthermore, the electronic device 100 is partially encapsulated by an encapsulation material 108 (e.g. a mold compound) onto which a reflection layer 109, e.g. made of aluminum, is formed. It should be noted that the reflection layer 109 and the aluminum layer 105 may of course be the same layer.

Such an electronic device or module 100 may be formed or manufactured by embedding a thinned semiconductor wafer (e.g. Si-wafer) at least partially within an encapsulation material and exposing the backside of the semiconductor wafer. The encapsulating may be done preferably after the frontside of the wafer has already be processed. In a next step the exposed backside may be (pre-)cleaned and a multilayer structure, comprising an aluminum, a titanium, and a titanium nitride layer may be formed, e.g. by sputtering. In addition or alternatively such a multilayer structure may comprise layers comprising NiVa, Sn, Al, Cu, AlNi or any typical compounds commonly used in the technical field.

Then the titanium and/or the titanium nitride layer may be structured, e.g. in a photolithography process including depositions and etching steps, for example. This structuring step may be particularly performed at the whole backside of the electronic device, i.e. in the region of the multilayer structure and the encapsulation material. Then the encapsulation material portion may be further processed, in particular the titanium and titanium nitride layer may be removed (e.g. etched) so that the reflective aluminum layer is exposed. Afterwards possible remaining layers of the photolithography process (e.g. remaining resist) may be removed, e.g. by a plasma (etching) step. Furthermore, a heating step (up to about 350° C.) may be performed as well as a part of the plasma process.

Alternatively, a locally energy introduction is performed, e.g. by radiating light, infrared radiation or laser, onto the backside of the electronic device. This can be either in a separate subsequent step or may be done simultaneously with a structuring and/or removing step of a photoresist (in particular, in case a mask is used which can be structured or patterned by a photolithography process). The simultaneously removing may be performed by using a plasma process including an additional heating process, e.g. by using a lamp like a halogen lamp.

During the energy deposition and due to the different outer surfaces, i.e. a reflective aluminum layer at the encapsulation material and a non-reflecting or absorbing layer in the region of the multilayer structure, the different portions are heated up to a different amount. This may result in a tempering process and/or diffusion process (e.g. diffusion of the aluminum into the semiconductor layer) in the region of the multilayer structure, while the temperature of the encapsulation material is maintained at a lower temperature.

Afterwards the absorption layer formed by the titanium nitride layer may be removed and a (pre-)cleaning of the multilayer structure may be performed. Then a typical metallization process including depositing (sputtering) a further seed layer and subsequent depositing of the metallization may be performed in order to provide a contact on the backside.

Figure 2:
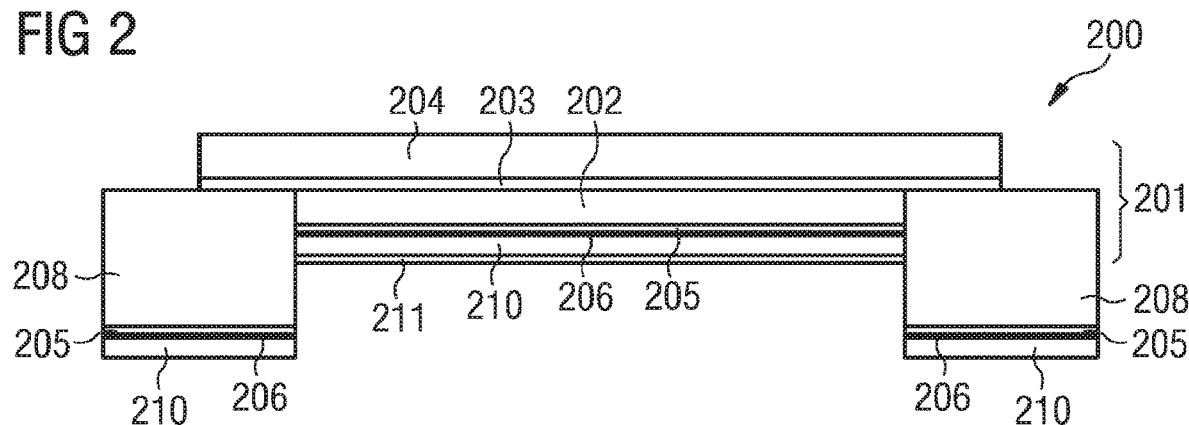
FIG. 2 schematically shows a detail of an electronic device according to another exemplary embodiment.

FIG. 2 schematically shows a detail of an electronic device 200 according to another exemplary embodiment. In particular, the electronic device 200 comprises a multilayer structure or stack 201 comprising an embedded chip 202 on the frontside of which an intermediate or contact layer 203 is arranged which comprises aluminum, for example, and on which in turn a metallization layer 204 is formed, e.g. made of copper, which forms the frontside contacts. Between the electronic chip 202 and the intermediate layer 203 a barrier layer, e.g. made of titanium, may be arranged.

On the backside of the embedded chip an aluminum layer 205 and a barrier layer 206 made of titanium may be arranged on the aluminum layer 205. Onto this (optional) barrier layer a copper layer 210 is deposited. For forming an absorption layer the copper layer is oxidized in the portion or region of the multilayer structure so that a layer of black copper is formed 211. At the portion of the encapsulation material (e.g. a mold compound) the copper is not oxidized so that it maintains its relatively high reflectivity.

Such an electronic device 200 may be formed or manufactured by embedding a thinned semiconductor wafer (e.g. Si-wafer) at least partially within an encapsulation material and exposing the backside of the semiconductor wafer. The encapsulating may be done preferably after the frontside of the wafer has already be processed. In a next step the exposed backside may be (pre-)cleaned and a multilayer structure, comprising an aluminum, a titanium or titanium-tungsten and a copper layer may be formed, e.g. by sputtering.

Then the copper layer may be processed, e.g. in a galvanic process to form copper oxide, a so called black oxide. This copper processing step may be particularly performed at the whole backside of the electronic device, i.e. in the region of the multilayer structure and the encapsulation material. Then the encapsulation material portion may be further processed, in particular the copper oxide may be removed (e.g. etched) so that the reflective copper layer is exposed. Alternatively, the copper layer may be removed as well so that the reflective aluminum/titanium-tungsten layer stack may be exposed. Afterwards possible remaining layers of the photolithography process (e.g. remaining resist) may be removed, e.g. by a plasma (etching) step. Furthermore, a heating step (up to about 350° C.) may be performed as well as a part of the plasma process.

Alternatively, a locally energy introduction is performed, e.g. by radiating light, infrared radiation or laser, onto the backside of the electronic device. Due to the different outer surfaces, i.e. a reflective aluminum/titanium-tungsten stack or copper layer at the encapsulation material and a non-reflecting or absorbing layer (black copper) in the region of the multilayer structure, the different portions are heated up to a different amount. This may result in a tempering process and/or diffusion process (e.g. diffusion of the aluminum into the semiconductor layer) in the region of the multilayer structure, while the temperature of the encapsulation material is maintained at a lower temperature. Alternatively or additionally the local energy introduction may be performed by using additional halogen lamps within a plasma step.

Afterwards the absorption layer formed by the black copper layer may be removed and a (pre-)cleaning of the multilayer structure may be performed. Then a typical metallization process including depositing (sputtering) a further seed layer and subsequent depositing of the metallization may be performed in order to provide a contact on the backside.

Figure 3:
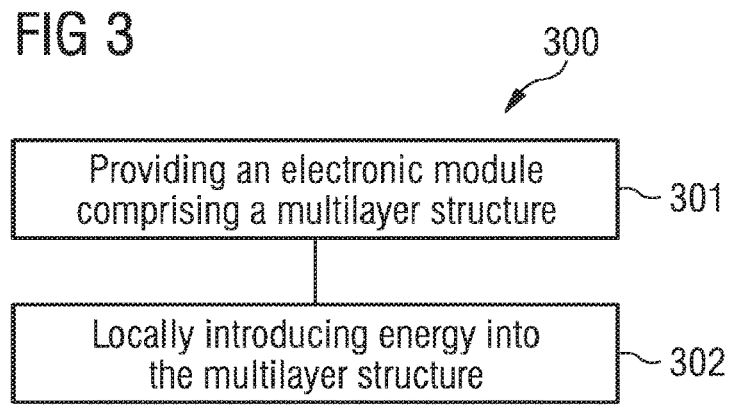
FIG. 3 illustrates a flowchart of a method of reducing a sheet resistance in an electronic device according to an exemplary embodiment.

FIG. 3 illustrate a flowchart 300 of a method of reducing a sheet resistance in an electronic device according to an exemplary embodiment. In a first step an electronic device or electronic module is provided wherein the electronic device comprises a multilayer structure which may be optionally at least partially encapsulated by an encapsulation material (step 301). Afterwards, energy is locally introduced into the multilayer structure for reducing a sheet resistance (step 302).

Summarizing exemplary embodiments may provide a process in which a (laser) tempering may be enabled wherein the tempered layers or portions of layers are already encapsulated by an encapsulation material, e.g. a mold compound, i.e. a tempering in a stacked structure or compound of chip and mold encapsulation may be enabled (even after a frontside and before a (complete) frontside processing already took place). For introducing locally energy it may be possible to use a focusable (direct-writing) laser. Additionally or alternatively a protection or shielding at the portions which shall not be heated up (e.g. by forming a reflective layer) may be applied and/or an absorption layer may be formed in the portions or regions to be heated up.

It should also be noted that the term "comprising" does not exclude other elements or features and the "a" or "an" does not exclude a plurality. Also elements described in association with different embodiments may be combined. It should also be noted that reference signs shall not be construed as limiting the scope of the claims. While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. An electronic device comprising:
   a semiconductor chip comprising a multilayer structure comprising a semiconductor layer and a metallization layer over the semiconductor layer,
   wherein the electronic device comprises a backside comprising at least one first portion that includes the metallization layer and at least one second portion,
   wherein an absorption layer covers a backside of the at least one first portion and a reflection layer covers a back surface of the at least one second portion, the absorption layer to absorb more radiation and the reflective layer to absorb less radiation from a light source arranged such that the absorption layer is between the light source and the backside of the at least one first portion and the reflection layer is between the light source and a back surface of the at least one second portion,
   wherein the at least one first portion and the at least one second portion were exposed to a different temperature during the manufacturing process of the electronic device.

2. The electronic device according to claim 1, wherein the at least one second portion is formed by an encapsulation material.

3. The electronic device according to claim 1, wherein the semiconductor layer has a thickness of less than 50 micrometer.

4. The electronic device according to claim 1, wherein the metallization layer may comprising a material selected out of the group consisting of:
   copper;
   aluminum; and
   a mixture thereof.

5. An electronic device comprising:
   a chip having a front side, a backside, and lateral sides extending between the front side and backside;
   an encapsulation material embedding the lateral sides of the chip and having a back surface facing in a same direction as the backside of the chip;
   an absorption layer covering the backside of the chip; and
   a reflection layer covering the back surface of the encapsulation material, the absorption layer to absorb more radiation and the reflection layer to absorb less radiation from a light source arranged such that the absorption layer is between the light source and the backside of the chip and the reflection layer is between the light source and the back surface of the encapsulation material, wherein the encapsulation material will be heated to a temperature less than that of material underlying the absorption layer in response to radiation from the light source.

6. The electronic device of claim 5, including:
   a metallization layer on the backside of the chip between the chip backside and the absorption layer.

7. The electronic device of claim 6, including:
   a diffusion region between the metallization layer and a material of the chip on the backside thereof.

8. The electronic device of claim 6, a barrier layer disposed between the metallization layer and the chip.

9. The electronic device of claim 8, the barrier layer comprising titanium.

10. The electronic device of claim 9, the absorption layer comprising TiN.

11. The electronic device of claim 5, the absorption layer comprising black copper.

12. The electronic device of claim 5, the reflection layer comprising aluminum.

13. The electronic device of claim 5, the reflection layer comprising copper.

* * * * *